(12) United States Patent
Goodman et al.

(10) Patent No.: US 9,477,550 B2
(45) Date of Patent: Oct. 25, 2016

(54) ECC BYPASS USING LOW LATENCY CE CORRECTION WITH RETRY SELECT SIGNAL

(71) Applicant: GLOBALFOUNDRIES Inc., Grand Cayman (KY)

(72) Inventors: Benjiman L. Goodman, Cedar Park, TX (US); Luis A. Lastras-Montano, Cortlandt Manor, NY (US); Eric E. Retter, Austin, TX (US); Kenneth L. Wright, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/062,856

(22) Filed: Oct. 24, 2013

(65) Prior Publication Data

US 2015/0121166 A1 Apr. 30, 2015

(51) Int. Cl.
*G11C 8/06* (2006.01)
*G11C 29/44* (2006.01)
(Continued)

(52) U.S. Cl.
CPC ....... *G06F 11/1076* (2013.01); *G06F 11/1012* (2013.01); *G06F 11/1052* (2013.01); *G11C 29/44* (2013.01); *G06F 11/10* (2013.01); *G06F 11/1048* (2013.01); *G11C 8/06* (2013.01); *G11C 29/42* (2013.01); *G11C 2029/0411* (2013.01)

(58) Field of Classification Search
CPC ............... G06F 11/1008; G06F 11/10; G06F 11/1052; G06F 11/1076; G06F 11/1012; G06F 11/1048; G11C 2029/0411; G11C 29/42; G11C 29/02; G11C 29/44; G11C 8/06

USPC ................. 714/763, 746, 764, 773
See application file for complete search history.

(56) References Cited

U.S. PATENT DOCUMENTS 4,112,502 A * 9/1978 Scheuneman .................. 714/5.1
4,852,100 A 7/1989 Christensen et al.
(Continued)

FOREIGN PATENT DOCUMENTS

EP 0348616 A2 1/1990

OTHER PUBLICATIONS

Texas Instruments, "Error Detection and Correction Mechanism of TMS320C64x+ and TMS320C674x" (May 2012).
(Continued)

*Primary Examiner* — James C Kerveros
(74) *Attorney, Agent, or Firm* — Heslin Rothenberg Farley & Mesiti P.C.; George Blasiak

(57) ABSTRACT

A memory controller is equipped with multiple error correction circuits for different complexity levels of errors, but requested data is initially sent to a requesting unit (e.g., processor) via a bypass path which provides the lowest memory latency. The requesting unit performs error detection and, if an error is found, sends a retry select signal to the memory controller. The retry select signal provides an indication of which error correction unit should be used to provide complete correction of the error but add the minimum latency necessary. On the retry transmission, the controller uses the particular error correction unit indicated by the retry select signal. The memory controller can also have a persistent error detection circuit which identifies an address as being defective when an error is repeatedly indicated by multiple retry select signals, and the control logic can automatically transmits the requested data using the appropriate error correction unit.

13 Claims, 3 Drawing Sheets

(51) Int. Cl.
  *G11C 29/42* (2006.01)
  *G11C 29/04* (2006.01)
  *G06F 11/10* (2006.01)

(56) References Cited

U.S. PATENT DOCUMENTS

| | | | | |
|---|---|---|---|---|
| 5,502,732 | A * | 3/1996 | Arroyo et al. | 714/746 |
| 5,604,753 | A * | 2/1997 | Bauer et al. | 714/763 |
| 6,161,208 | A * | 12/2000 | Dutton et al. | 714/764 |
| 6,374,381 | B1 * | 4/2002 | Moriya | 714/746 |
| 6,654,925 | B1 | 11/2003 | Meaney et al. | |
| 7,117,420 | B1 * | 10/2006 | Yeung et al. | 714/763 |
| 7,984,357 | B2 | 7/2011 | Kirscht et al. | |
| 8,181,094 | B2 | 5/2012 | Lastras-Montano et al. | |
| 8,438,344 | B2 * | 5/2013 | Kumar et al. | 711/155 |
| 8,527,837 | B2 * | 9/2013 | Furno et al. | 714/763 |
| 8,615,700 | B2 * | 12/2013 | Dave et al. | 714/773 |
| 8,694,857 | B2 * | 4/2014 | Wang et al. | 714/763 |
| 8,793,554 | B2 * | 7/2014 | Billing et al. | 714/764 |
| 2010/0332942 | A1 * | 12/2010 | Wezelenburg | G06F 11/1048 714/763 |
| 2011/0161769 | A1 | 6/2011 | Vash et al. | |
| 2013/0198587 | A1 | 8/2013 | Kim | |

OTHER PUBLICATIONS

Final Office Action from United States Patent and Trademark Office in U.S. Appl. No. 14/098,561 dated Jan. 28, 2016.
Response to Final Office Action from the United States Patent and Trademark Office in U.S. Appl. No. 14/098,561, filed Mar. 28, 2016.
Office Action from United States Patent and Trademark Office in U.S. Appl. No. 14/098,561 dated Sep. 4, 2015.
Response to Office Action from the United States Patent and Trademark Office in U.S. Appl. No. 14/098,561, filed Dec. 4, 2015.
Notice of Allowance dated Apr. 19, 2016 for U.S. Appl. No. 14/098,561.

* cited by examiner

ECC BYPASS USING LOW LATENCY CE CORRECTION WITH RETRY SELECT SIGNAL

BACKGROUND OF THE INVENTION

1. Field of the Invention

The present invention generally relates to data processing systems, and more particularly to a method of transmitting data using error correction codes.

2. Description of the Related Art

The basic structure of a conventional computer system includes one or more processing units connected to a memory hierarchy and various peripheral devices such as a display monitor, keyboard, network interface, and permanent storage device. The processing units communicate with memory and the peripheral devices by various means, including a generalized interconnect or bus. In a symmetric multi-processor (SMP) computer, all of the processing units are generally identical, that is, they all use a common set or subset of instructions and protocols to operate, and generally have the same architecture. An exemplary processing unit is the POWER processor marketed by International Business Machines Corp. The processing units can also have one or more caches, such as an instruction cache and a data cache, which are implemented using high speed memory devices. Caches are commonly used to temporarily store values that might be repeatedly accessed by a processor, in order to speed up processing by avoiding the longer step of loading the values from system memory (i.e., random-access memory, or RAM). These caches are referred to as "on-board" when they are integrally packaged with the processor core on a single integrated chip. Each cache is associated with a cache controller (not shown) that manages the transfer of data between the processor core and the cache memory. The memory hierarchy can include additional caches such as a level 2 (L2) cache which supports the on-board (level 1) caches. The L2 cache acts as an intermediary between system memory and the on-board caches, and can store a much larger amount of information (instructions and data) than the on-board caches can, but at a longer access penalty. Multi-level cache hierarchies can be provided where there are many levels of interconnected caches.

When providing memory values (instructions or operand data), the memory controller or cache controller can use an error correction code (ECC) circuit to detect and correct certain errors in the values received from the memory array for transmission to the requesting unit (i.e., processor). A bit in a value may be incorrect either due to a soft error (such as stray radiation or electrostatic discharge) or to a hard error (a defective cell). ECCs can be used to reconstruct the proper data stream. Many error control codes provide information about the specific location of the erroneous bit(s). Some ECCs can only be used to detect and correct single-bit errors, i.e., if two or more bits in a particular block are invalid, then the ECC might not be able to determine what the proper data stream should actually be, but at least the failure can be detected. Other ECCs are more sophisticated and allow detection or correction of double errors, and some ECCs further allow the memory word to be broken up into clusters of bits, or "symbols," which can then be analyzed for errors in even more detail. These latter errors are costly to correct, but the design tradeoff is to halt the machine when double-bit (or higher-order) errors occur. Error-correcting memory controllers traditionally use Hamming codes, although some use triple modular redundancy. The cache or system memory may be a "mark store" array which contains error information for each memory block or cache line. Whenever an error is encountered, the bit locations affected by the error can be stored in the mark store array for a particular rank in main memory. A rank in main memory refers to a specific memory module that accesses the cache line. Multiple memory modules can use a single cache, but only one module can access the cache line at a time.

SUMMARY OF THE INVENTION

The present invention is generally directed to a method and related systems for providing requested data from a memory device of a computer system to a requesting unit of the computer system, by first transmitting the requested data as uncorrected data with correction information from a controller of the memory device to the requesting unit using a bypass path having a bypass latency, using the correction information at the requesting unit to determine that the uncorrected data contains an error having a specific complexity level, and sending a retry select signal from the requesting unit to the controller wherein the retry signal is based on the specific complexity level. The controller can then transmit the requested data as corrected data from the controller to the requesting unit using a selected one of a plurality of error correction units based on the retry select signal, wherein the error correction units provide different complexity levels of error correction and have different correction circuit latencies, each of the correction circuit latencies being greater than the bypass latency. The memory device can be a system memory device of the computer system in which case the controller is a system memory controller. The requesting unit may for example be a processor of the computer system. Although execution of a retry read increases latency for this single operation, overall throughput of the memory controller is considerably increased by providing multiple correction outputs and selecting the one output which is required for complete correction at that complexity level but provides minimum added latency. In the exemplary embodiment there are three error correction units including a 2-bit correction unit, a 4-bit correction unit, and an 8-bit correction unit.

The memory controller can also have a persistent error detection circuit which identifies the memory address of the requested data as being defective when an error is repeatedly indicated for the address by multiple retry select signals, and the control logic can compare the memory address of the requested data to a list of addresses identified by the persistent error detection circuit as having persistent errors with associated complexity levels and, when the memory address of the requested data matches an address in the list, the control logic automatically transmits the requested data using the appropriate error correction unit. The persistent error detection circuit can increment a corresponding counter each time an error is detected for the memory address of the requested data, and identifies the memory address as being defective when the counter exceeds a predefined threshold value. The predefined threshold value can be programmable, e.g., via the operating system.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Even though DRAM speeds have slowly improved over recent years, they have not kept up with increases in processor core speeds. Thus memory latency, relative to processor clock rates, has actually degraded. The recent trend toward higher core counts per microprocessor chip has resulted in additional pressure to increase the chip-to-chip interconnect and DRAM memory bit rates. These higher bit rates are critical for providing the memory data bandwidth needed to keep the processor cores fed with data. However, these higher bit rates result in higher inherent bit error rates on the interconnects, requiring more robust ECC and/or cyclical redundancy codes (CRCs) to ensure a reasonable level of data integrity. These more complex error correcting codes in turn have a negative impact on memory latency due to the need for deeper ECC and/or CRC logic pipelines for data checking and correction. Also, more cores require more cache/memory queuing structures to keep up with the large number of outstanding load operations that cannot be sourced from the cache hierarchy (i.e., a cache "miss"). The traditional means of improving effective memory latency has been via the use of on-chip caches to bring frequently used data closer to the consuming cores. Limits in overall microprocessor solution-on-a-chip (SOC) sizes forces a tradeoff between the number of cores on a chip and the amount of cache on the chip. Thus from a pure cache capacity standpoint the opportunity to improve effective memory load latency further is limited.

It would, therefore, be desirable to devise an improved method of reducing memory latency. It would be further advantageous if the method could reduce the depth of queuing structures in the memory hierarchy required to prevent the stalling of execution streams. These objects are achieved in the present invention by providing multi-output error correction logic which initially transmits requested data to a master unit in uncorrected form but with correction data, and then re-transmits the requested data through a selected error correction output (2-bit, 4-bit, etc.) based on a retry signal from the master unit which detected an error at a specific complexity level. If a persistent error is discovered, associated data can automatically be transmitted via the appropriate error correction output in future operations.

Figure 1:
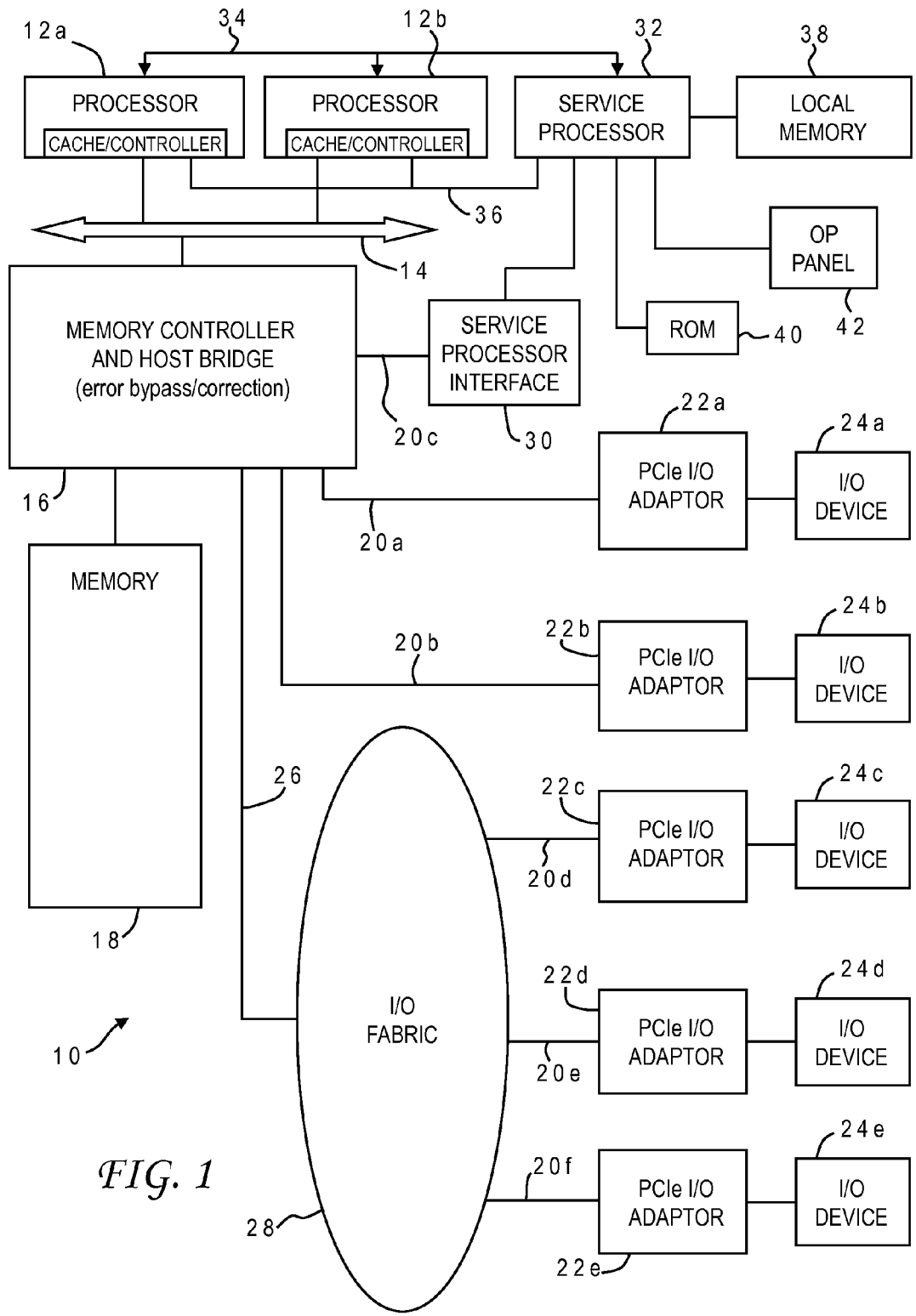
FIG. 1 is a block diagram of a computer system constructed in accordance with one embodiment of the present invention.

With reference now to the figures, and in particular with reference to FIG. 1, there is depicted one embodiment 10 of a computer system constructed in accordance with the present invention. Computer system 10 is a symmetric multiprocessor (SMP) system having a plurality of processors 12a, 12b connected to a system bus 14. System bus 14 is further connected to and communicates with a combined memory controller/host bridge (MC/HB) 16 which provides an interface to system memory 18. System memory 18 may be a local memory device or alternatively may include a plurality of distributed memory devices, preferably dynamic random-access memory (DRAM). System memory is distinguished from other structures in the memory hierarchy in that the addressing schemes used by the operating system of the computer refer to addresses of the system memory. There may be additional structures in the memory hierarchy, such as on-board (L1) caches within processors 12a and 12b, and second-level (L2) or third-level (L3) caches which are not depicted.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

Figure 2:
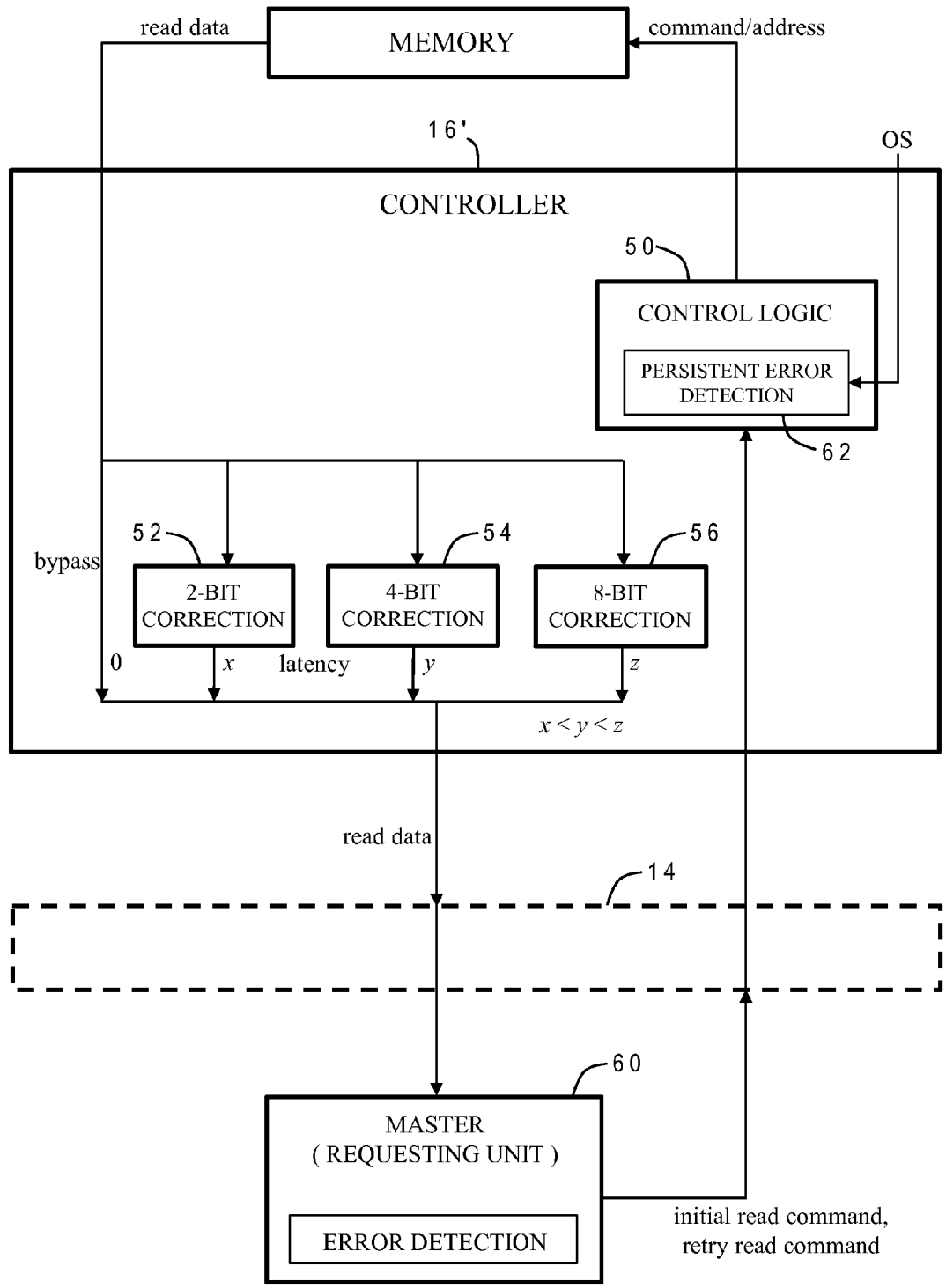
FIG. 2 is a block diagram illustrating a memory or cache controller with an error correction selection circuit that allows an error bypass or selects an appropriate correction unit based on a retry signal from a requesting unit (master) in accordance with one implementation of the present invention.

With further reference to FIG. 2, there is depicted a controller 16' which in the exemplary embodiment is a memory controller for system memory 18, but those skilled in the art will appreciate that the teachings herein may also be applied to a cache controller or other controller for a memory device. Controller 16' contains CRC error detection and correction circuitry that can correct errors having different complexity levels, e.g., single symbol (2 data bit) errors, as well as full x4 or x8 DRAM chip errors. This circuitry includes control logic 50, 2-bit correction logic 52, 4-bit correction logic 54, and 8-bit correction logic 56 (it is understood that the number of bits actually modified by the correction logic may be more than the number indicated by these examples, e.g., 2-bit correction logic may affect a full byte of data). When a load instruction is issued by a master 60 (e.g., processor core) and the corresponding memory block (or cache line) is received from the memory array it is transmitted to master 60 via one of the outputs. The default operation of control logic 50 is a bypass mode wherein raw (uncorrected) memory read data is delivered with error information included with the last data transfer via a bypass line or path, i.e., without passing through any detection/correction circuitry (relative latency of zero). Depending upon the system architecture the data may travel through one or more buses or interconnects 14 on its way to master 60. Controller 16' may include other conventional features of memory controllers, not shown.

Master 60 includes error detection circuitry. If an error is indicated on the last data transfer by this circuitry, the master requesting the data issues a retry command (select signal) to controller 16', to execute the read as a non-bypass operation. On the non-bypass retry read, the memory read data is now diverted according to the command issued by control logic 50 through the appropriate correction logic. For example, if master 60 detects a 2-bit error in the raw data (the lowest error complexity level for this implementation) it can transmit a "1" value as the retry command (binary "01"), while detection of a 4-bit error (intermediate complexity level) will result in a retry command with a "2" value (binary "10"), and detection of an 8-bit error (highest complexity level) will result in a retry command with a "3" value (binary "11"). The retry command may or may not pass through the same bus or interconnect 14 used to deliver the data. When control logic 50 receives a "1" retry signal it will instruct the memory to transmit data via 2-bit correction logic 52, when control logic 50 receives a "2" retry signal it will instruct the memory to transmit data via 4-bit correction logic 54, and when control logic 50 receives a "3" retry signal it will instruct the memory to transmit data via 8-bit correction logic 56. Those skilled in the art will appreciate that more than three correction circuits can be provided, and any error correction codes can be used with the invention, not just CRC.

The computations required to correct a symbol error require less logic and time than the computations required to correct a full DRAM chip error. If the relative latency of the bypass operation is 0, then the latency for 2-bit correction will be x, the latency for 4-bit correction will be y, and the latency for 8-bit correction will be z, where $x<y<z$. Although execution of a retry read increases latency for this single operation, overall throughput of the memory controller is considerably increased by providing multiple correction outputs and selecting the one output which is required for complete correction at that complexity level but provides minimum added latency.

In laboratory test and field environments, persistent DRAM symbol errors are often observed. Such errors could conceivably affect every address in a DRAM chip. If a symbol error is detected on a bypass read operation, the read operation would have to be retried as a non-bypass operation to get correct read data, for every access to the DRAM chip with the bad symbol, resulting in a large overall increase in read latency. One solution to this problem is to detect the persistent symbol error and disable read bypass operations to the DRAM chip. However, this requires that read data flow through the ECC detection and correction logic, also resulting in increased latency. A better solution is to dynamically configure controller 16' to use the appropriate correction circuitry once a persistent error is repeatedly detected. This solution may be achieved by providing control logic 50 with a persistent error detection circuit 62 which receives all retry read signals from any master using controller 16'. Persistent error detection circuit 62 may contain an internal array to store addresses for any memory blocks which are found to be transmitted with one or more errors. Each time an error is detected for the same address, persistent error detection circuit 62 increments a corresponding counter. If the counter exceeds some predefined threshold value (e.g., 3), then the memory block is considered as defective, and persistent error detection circuit 62 passes that address to control logic 50 as being associated with a persistent error, and also passes the necessary retry select value. The threshold counter value may be programmable, e.g., by the operating system, using a register within persistent error detection circuit 62. Control logic 50 compares each incoming address for read operations to a record or list of defective addresses and when any match is found, control logic 50 automatically knows to transmit the requested data via the appropriate correction circuitry.

It is possible that a memory location has previously been identified as defective by persistent error detection circuit 62 and a later read operation will take place via one of the indicated error correction units (e.g., 2-bit correction logic 52), but this attempt to correct the data may still result in an error which requires a higher complexity level of correction (e.g., the read data now has a 4-bit error instead of just a 2-bit error). In such a case, the requesting unit will again send a retry signal back to memory but the retry signal will now provide an indication that the higher complexity level of correction is necessary. Accordingly, the term "uncorrected data" means not fully corrected, i.e., data for which the error detection circuit within the requesting unit can still detect an error, even though the data may have undergone some attempt at correction.

Figure 3:
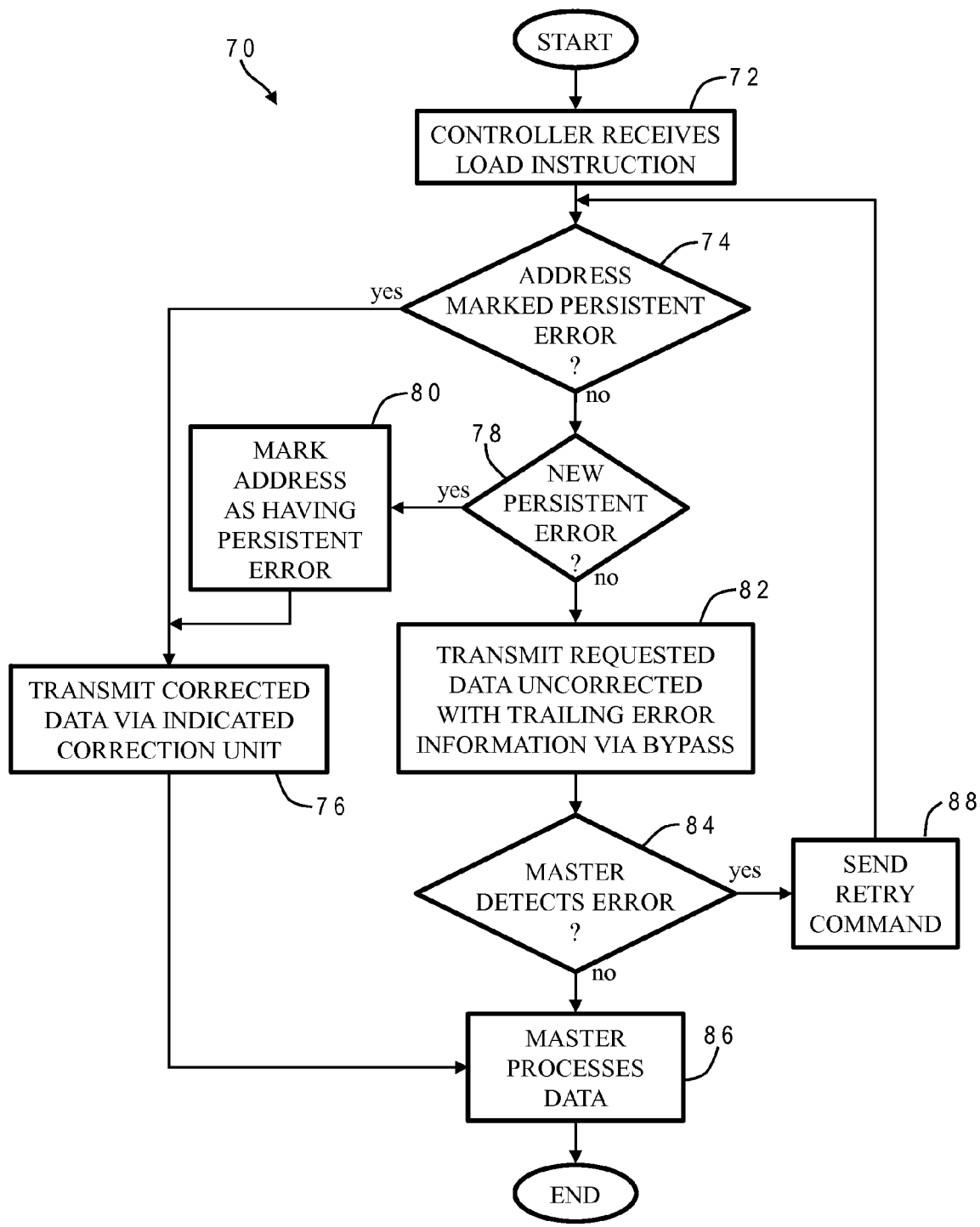
FIG. 3 is a chart illustrating the logical flow for handling a load instruction (read operation) in accordance with one implementation of the present invention.

The invention may be further understood with reference to the chart of FIG. 3 which illustrates the logical flow for a read operation 70 in accordance with one implementation.

Process 70 begins with the memory controller receiving the load instruction from the master unit (72). The address for the requested data is first compared to addresses previously identified as having persistent errors (74). If there is an address match, the memory controller transmits corrected data via the indicated correction unit (76). If a new persistent error is detected (78), the address is marked as such (80), and corrected data is again transmitted using the indication correction unit (76). If the requested address is not associated with a persistent error, then data is transmitted in uncorrected form via the bypass with trailing error information (82). In this case the master will further check the data for any error (84). If no error is found, the data is processed without any correction (86). However, if the master detects an error from the bypass data, it sends a retry command to the memory controller to allow selection of the proper correction circuitry (88).

In this manner, the invention provides an improved method for reducing memory latency which optimizes error correction. An additional benefit is a reduction in the depth of queuing structures and related circuitry for the memory hierarchy.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A controller for a memory device of a computer system comprising:
   a read data line which receives uncorrected data with correction information for a memory address corresponding to requested data which is requested by a requesting unit of the computer system;
   a bypass path for transmitting the uncorrected data with the correction information to the requesting unit, said bypass path having a bypass latency;
   a plurality of error correction units which provide different complexity levels of error correction and have different correction circuit latencies, each of the correction circuit latencies being greater than the bypass latency, wherein there are at least three error correction units including a 2-bit correction unit, a 4-bit correction unit, and an 8-bit correction unit; and
   control logic which first transmits the uncorrected data with the correction information from said read data line to the requesting unit using said bypass path and, in response to a retry select signal from the requesting unit indicating an error in the uncorrected data having a specific complexity level, second transmits the requested data as corrected data from said read data line to the requesting unit using a selected one of said error correction units based on the retry select signal, wherein the correction circuit latency of the selected error correction unit adds a minimum latency necessary to provide complete correction of the uncorrected data; and
   a persistent error detection circuit which identifies the memory address of the requested data to be defective when an error is repeatedly indicated for the address by multiple retry select signals.

2. The controller of claim 1 wherein said control logic compares the memory address of the requested data to a list of addresses identified as having persistent errors with associated complexity levels and, when the memory address of the requested data matches an address in the list, said control logic automatically transmits the requested data using one of the error correction units based on an associated complexity level.

3. The controller of claim 1 wherein said persistent error detection circuit increments a corresponding counter each time an error is detected for the memory address of the requested data, and identifies the memory address to be defective when the counter exceeds a predefined threshold value.

4. The controller of claim 3 wherein the predefined threshold value is programmable.

5. The controller of claim 1 wherein the 2-bit correction circuit unit has a shorter correction circuit latency than a correction circuit latency of the 4-bit correction circuit unit, wherein the 4-bit correction circuit unit has a shorter correction circuit latency than a correction circuit latency of the 8-bit correction circuit unit.

6. The controller of claim 1 wherein the controller is configured so that the controller uses one of plurality of error correction units when requested data is from a memory address previously determined to have a persistent error.

7. The controller of claim 1 wherein the controller is configured so that the controller uses one of plurality of error correction units, without there being a performed a specified error detection which otherwise is performed, when requested data is from a memory address previously determined to have a persistent error.

8. The controller of claim 1 wherein the controller is configured so that the bypass path is disabled for requested data that is requested from a memory address previously determined to have a persistent error.

9. A computer system comprising:
   one or more processors which process program instructions;
   a system memory device having a plurality of addressable memory values; and
   a memory controller having a read data line which receives uncorrected data with correction information from said system memory device for a memory address corresponding to requested data which is requested by a requesting one of said processors, a bypass path for transmitting the uncorrected data with the correction information to said requesting processor wherein said bypass path has a bypass latency, a plurality of error correction units which provide different complexity levels of error correction and have different correction circuit latencies wherein each of the correction circuit latencies is greater than the bypass latency, and control logic which first transmits the uncorrected data with the correction information from said read data line to said requesting processor using said bypass path and, in response to a retry select signal from said requesting processor indicating an error in the uncorrected data having a specific complexity level, second transmits the requested data as corrected data from said read data line to said requesting processor using a selected one of said error correction units based on the retry select signal, wherein the selected error correction unit adds a minimum latency necessary to provide complete correction of the uncorrected data, wherein said memory controller further has a persistent error detection circuit which identifies the memory address of the requested data to be defective when an error is repeatedly indicated for the address by multiple retry select signals, and said control logic compares the memory address of the requested data to a list of addresses identified by said persistent error detection circuit as having persistent errors with associated complexity levels and, when the memory address of the requested data matches an address in the list, said control logic automatically transmits the requested data using one of said error correction units based on an associated complexity level.

10. The computer system of claim 9 wherein there are at least three error correction units including a 2-bit correction unit, a 4-bit correction unit, and an 8-bit correction unit.

11. The computer system of claim 9 wherein said persistent error detection circuit increments a corresponding counter each time an error is detected for the memory address of the requested data, and identifies the memory address to be defective when the counter exceeds a predefined threshold value.

12. The computer system of claim 11 wherein the predefined threshold value is programmable.

13. A computer system comprising:
one or more processors which process program instructions;
a system memory device having a plurality of addressable memory values; and
a memory controller having a read data line which receives uncorrected data with correction information from said system memory device for a memory address corresponding to requested data which is requested by a requesting one of said processors, a bypass path for transmitting the uncorrected data with the correction information to said requesting processor wherein said bypass path has a bypass latency, a plurality of error correction units which provide different complexity levels of error correction and have different correction circuit latencies wherein each of the correction circuit latencies is greater than the bypass latency, and control logic which first transmits the uncorrected data with the correction information from said read data line to said requesting processor using said bypass path and, in response to a retry select signal from said requesting processor indicating an error in the uncorrected data having a specific complexity level, second transmits the requested data as corrected data from said read data line to said requesting processor using a selected one of said error correction units based on the retry select signal, wherein the selected error correction unit adds a minimum latency necessary to provide complete correction of the uncorrected data, wherein said memory controller further has a persistent error detection circuit which identifies the memory address of the requested data to be defective when an error is repeatedly indicated for the address by multiple retry select signals.

* * * * *